(12) United States Patent
Greco et al.

(10) Patent No.: US 12,396,270 B2
(45) Date of Patent: Aug. 19, 2025

(54) METHOD OF MANUFACTURING A SOLAR CELL WITH INTEGRAL COVER GLASS, AND CELL OBTAINED

(71) Applicant: CESI—Centro Elettrotecnico Sperimentale Italiano Giacinto Motta S.P.A., Milan (IT)

(72) Inventors: Erminio Greco, Milan (IT); Mariacristina Casale, Milan (IT); Roberta Campesato, Milan (IT)

(73) Assignee: CESI—Centro Elettrotecnico Sperimentale Italiano Giacinto Motta S.p.A., Milan (IT)

( * ) Notice: Subject to any disclaimer, the term of this patent is extended or adjusted under 35 U.S.C. 154(b) by 0 days.

(21) Appl. No.: 17/759,085

(22) PCT Filed: Jan. 15, 2021

(86) PCT No.: PCT/EP2021/050818
§ 371 (c)(1),
(2) Date: Jul. 19, 2022

(87) PCT Pub. No.: WO2021/148323
PCT Pub. Date: Jul. 29, 2021

(65) Prior Publication Data
US 2023/0039806 A1  Feb. 9, 2023

(30) Foreign Application Priority Data
Jan. 21, 2020  (IT) ............. 102020000001051

(51) Int. Cl.
*H10F 19/80* (2025.01)
*H10F 77/30* (2025.01)

(52) U.S. Cl.
CPC ......... *H10F 19/807* (2025.01); *H10F 77/311* (2025.01)

(58) Field of Classification Search
CPC ................................................ H01L 31/041
See application file for complete search history.

(56) References Cited

U.S. PATENT DOCUMENTS 3,780,424 A * 12/1973 Forestieri ............ H01L 31/0504
136/251
8,974,899 B1  3/2015 Wilt
(Continued)

FOREIGN PATENT DOCUMENTS

RU  2584184 C1 *  5/2016 ........... H01L 31/041

OTHER PUBLICATIONS

Machine translation of RU2584184C1 (Year: 2016).*
Hadi Shaima M. et al, "Stopping power and range of proton interaction with AL2O3, ZrO2 and SiO2", AIP Conference Proceedings 2201, 020017 (2019); https://doi.org/10.1063/1.5148441, Published Online: Dec. 17, 2019.
(Continued)

*Primary Examiner* — Ryan S Cannon
(74) *Attorney, Agent, or Firm* — John Janeway; Janeway Patent Law PLLC

(57) ABSTRACT

Method of manufacturing a solar cell, comprising: providing a solar cell (100) having an active surface (105*a*) intended, in use, to be exposed to sunlight; forming, in correspondence of said active surface, a protection against low-energy protons and other radiations harmful to the solar cell. Forming a protection comprises forming a layer of resin (110; 210) and forming by deposition of material on the resin layer a layer of protective material (115; 215*b*) on top of the resin layer.

17 Claims, 3 Drawing Sheets

(56) References Cited

U.S. PATENT DOCUMENTS

| | | | |
|---|---|---|---|
| 2009/0075098 A1* | 3/2009 | Tsukahara | H10K 50/844 |
| | | | 156/60 |
| 2010/0078075 A1* | 4/2010 | Tsukahara | B82Y 10/00 |
| | | | 136/263 |
| 2010/0297798 A1* | 11/2010 | Adriani | H01L 31/0481 |
| | | | 257/E31.117 |
| 2012/0090661 A1 | 4/2012 | Capps et al. | |
| 2012/0228668 A1* | 9/2012 | Thoumazet | H01L 31/048 |
| | | | 257/E51.026 |
| 2014/0007924 A1 | 1/2014 | Gray | |
| 2019/0172955 A1* | 6/2019 | Kruse | B64D 27/02 |

OTHER PUBLICATIONS

Capali Veli et al., "Geant4 calculations for space radiation shielding material Al2O3", EPJ Web of Conferences 100, 02002 (2015), 2015, DOI:10.1021/epjconf/201510002002.

D. Roth et al., "Electronic Stopping of Slow Protons in Oxides: Scaling Properties" Physical Review Letters, Oct. 20, 2017; PRL 119, 163401 (2017); DOI: 10.1103/PhysRevLett.119.163401.

Roberta Campesato et al., "Effective Coating for High Efficiency Triple Junction Solar Cells", Published in 2019 European Space Power Conference (ESPC); Date of Conference: Sep. 30, 2019-Oct. 4, 2019; DOI: 10.1109/ESPC.2019.892034.

Samuel F. Pellicori et al., "Development and testing of coatings for orbital space radiation environments", Applied Optics, vol. 53, No. 4, Feb. 1, 2014; Published Jan. 23, 2014; Doc. ID 195444; XP-001587806.

* cited by examiner

METHOD OF MANUFACTURING A SOLAR CELL WITH INTEGRAL COVER GLASS, AND CELL OBTAINED

BACKGROUND OF THE INVENTION

Technical Field

The present invention relates in general to the field of solar cells and their manufacture. As known, solar cells, or photovoltaic cells, are solid-state (semiconductor) electrical/electronic devices that convert the energy of sunlight incident on them into electricity via the photovoltaic effect. Solar cells are a type of photoelectric cells, defined as devices whose electrical characteristics, such as current and voltage, vary when exposed to light. In particular, the present invention relates to a method of manufacturing a solar cell with protection against low-energy protons (and other harmful radiations), and a solar cell obtained by such manufacturing method.

Overview of the State of the Art

Solar cells, in particular those intended for uses in the space (hereinafter, concisely, "space solar cells") or at high altitude, need a protection capable of shielding them from low-energy protons (and other harmful radiations) and to protect them mechanically.

Currently, a typical protection for solar cells consists of a glass (so-called "coverglass" or "coverslip") in borosilicate doped with Cerium, which is glued on the active surface of each solar cell individually (the active surface of a solar cell being the surface which, in use, is intended to be exposed to sunlight), using a transparent resin that reduces the mechanical stress between the glass and the solar cell itself.

In U.S. Pat. No. 8,974,899 B1 a flexible hybrid coverglass for solar panels for spacecraft is described, consisting of small drops of fused silica or Cerium-doped borosilicate glass embedded in a matrix of traditional adhesives for the glass.

In US 2014/0007924 A1 a stable screen to radiation for use in space applications or at high altitudes is described. The screen comprises a plurality of overlapping planar glass flakes which are held in a lamellar matrix of flexible polymeric material. The flakes are each comprised of a radiation-stable glass that is suitable for use in space or high-altitude applications. The flakes are arranged aligned with the lamellar direction of the matrix.

US 2008/173349 A1 discloses a light weight photovoltaic device for use in stratospheric and outer space applications. The device includes a protective surface coating on the light incident side thereof. The protective coating does not deleteriously affect the photovoltaic properties of the solar cell, is formed of a material which protects said solar cell from the harsh conditions in the stratospheric or outer space environment in which the photovoltaic device is adapted to be used, and remains substantially unchanged when exposed to the harsh conditions in the stratosphere or outer space. The protective coating is made of a spray coated silicone based material and is between 0.01 and 2 mil thick. The silicone based overcoat is prepared by a chemical spray process, using commercial spray coating equipment. The coating is then cured at elevated temperature. Suitable silicone based material is DOW CORNING® 1-2620 (Low VOC Conformal Coating or dispersion) diluted with DOW CORNING® OS-30 solvent. An additional layer of a transparent conductive material is deposited over the silicone layer to provide additional protection in the outer space environment, that is, added protection from UV radiation, as well as it allows for leakage of electrostatic charge, helping to prevent destructive ESD events. The transparent conductive layer includes layers of Indium-Tin-Oxide (ITO) or Zinc oxide (ZnO).

WO 84/02529 A1 discloses that solar cells, particularly those positioned in space, require a coating to protect the solar cell against damage caused by solar radiation. The document discloses a protective coating which is a polyimide which has the required combination of properties of being colorless, transparent, relatively non-brittle, having a high degree of thermal stability and readily transmitting solar radiation without appreciable degradation. The coating is heat resistant and does not degrade significantly when exposed to ultraviolet radiation, and is highly effective in repelling low energy proton particles. The protective polyimide coating is a polymer having the recurring structural unit. An anti-reflective coating (a combination of $TiO_X$ and $Al_2O_3$, $Ta_2O_5$ or $SiO_X$) is deposited directly on the active surface of the cell prior to application of the polyimide protective coating. Prior to the application of the polyimide coating, a primer coating (a silane adhesion promoter, such as aminopropyltrimethoxysilane) is applied to the upper surface of the anti-reflective coating. The primer coating increases the adhesion of the polyimide coating to the solar cell and particularly to the upper surface of the anti-reflective coating.

Carol L. Martinez et al., "Test Results of Radiation Resistant Coatings Integrated with Flexible Substrate Materials and Active Solar Cells", 2016 IEEE $43^{rd}$ Photovoltaic Specialists Conference (PVSC), 5 Jun. 2016, p. 2586-2591 discloses the development of radiation resistant UV reflector and wide-band anti-reflection (UVR/AR) and proprietary transparent conductive oxide (TCO) coatings for use with flexible coverglass materials such as Pseudo-Morphic Glass (PMG) and other silicone-based covers. Coatings deposited on flexible substrate materials were subjected to mechanical and space-environment durability tests. Coated flexible substrates were then integrated (CIC'd) with active IMM and other cell types.

Roberta Campesato et al., "Effective Coating for High Efficiency Triple Junction Solar Cells", 2019 European Space Power Conference (ESPC), 30 Sep. 2019, p. 1-5 discloses that an important field to improve solar cell efficiency is the optimization of the antireflection coating (ARC) to allow more light to be converted; from a theoretical point of view this could increase the solar cell efficiency of 0.5%. Different ARC designs have been investigated, the most promising approaches being based on multi layers or gradient index approaches. These approaches have been theoretically and experimentally optimized to increase the photocurrent in the spectral range 300-1880 nm.

SUMMARY OF THE INVENTION

The Applicant has ascertained that the protective glasses currently used for the protection of solar cells, particularly space solar cells or solar cells for high-altitude applications, have some disadvantages, among which the lack of flexibility and the high cost of integration.

The protective glass to be used shall have specific characteristics depending on the particular type of solar cell and the particular application of the solar cell itself. Therefore, the protective glasses shall be customized, made ad hoc. This is expensive both in terms of supply times and in terms of costs (so-called "non-recurring costs") inherent in the design of glasses having characteristics, such as size, from time to time different. Furthermore, the whole process for making and applying protective glasses to solar cells is completely detached from the manufacturing process of the solar cells themselves (which is based on semiconductor technology).

Concerning US 2008/173349 A1, the Applicant notices that the protection against the harsh conditions in the stratospheric or outer space environment is provided by the coating made of a spray coated silicone based material. The additional layer of transparent conductive material (ITO or ZnO) deposited over the silicone layer is conductive because it is devoted to provide added protection from UV radiation and to allow for leakage of electrostatic charge, helping prevent destructive ESD events.

The Applicant observes that the use of electrically conductive oxides like ITO and ZnO limits the thickness of the protective layer that can be formed, not to hinder the transparency of the protective layer to sunlight, which would be detrimental to the conversion efficiency of the solar cell. Thus, the protection against low-energy protons is limited. Moreover, the use of a transparent conductive material limits the suitable materials, not allowing a choice of the material with the better refractive index.

In respect of WO 84/02529 A1, the Applicant notices that the protection for the solar cell is given by the polyimide coating. The primer coating serves for increasing the adhesion of the polyimide coating to the solar cell and particularly to the upper surface of the anti-reflective coating, not for the protection for the solar cell. The Applicant further notices that in WO 84/02529 A1 a thin (thickness less than 1 μm) anti-reflective coating layer (a combination of $TiO_X$ and $Al_2O_3$, $Ta_2O_5$ or $SiO_X$) is deposited directly on the active surface of the cell prior to application of the polyimide protective coating, i.e. the anti-reflective coating is under the polyimide coating (and under the primer coating).

The Applicant notices that in the paper by Carol L. Martinez et al. the coatings deposited over the PMG and other silicon-based covers (FIG. 1 of the paper) are thin-film layers having the purpose of protecting the solar cell against exposure to atomic oxygen and UV radiation. The coatings must resist to (not protect against) the ionizing radiation (gamma rays, X rays, charge carriers—electrons and protons—trapped by the Earth magnetic field) existing in space environment. The coatings, being anti-reflective or UV-reflective, are typically thin (FIGS. 2 and 3 of the paper report thicknesses of 8 nm, 15 nm and 16 nm for the transparent conductive oxide—TCO—coating; it can be appreciated that even an increase of few nanometers—from 8 nm to 15 nm to 16 nm—in the TCO coating thickness already causes a significant decrease in the spectral transmittance of the coatings in the range of wavelengths from 300 nm to 500 nm).

The paper by Roberta Campesato et al. deals with anti-reflective coatings deposited directly on the active surface of the solar cell. The purpose of the anti-reflective coatings is to minimize the reflection of sun light. The Applicant observes that the anti-reflective coatings, being anti-reflective, are typically thin.

The Applicant has faced the problem of identifying a solution to the problem of protecting solar cells against low-energy protons (and other harmful radiations) encountered in space environment and at high altitude in atmosphere, which does not involve the drawbacks associated with the use of protective glasses.

The Applicant has found that it is possible to provide a protection for a solar cell, against low-energy protons (and other harmful radiations) encountered in space environment and at high altitude in atmosphere, by direct formation (e.g., by deposition of material), on the active surface of the solar cell (the surface which, in use, is intended to be exposed to sunlight), of one or more layers of protective material(s), suitable to protect the solar cell against low-energy protons and other radiations harmful to the solar cell (hereinafter, for the sake of brevity, also called "protective material(s)"), of suitable thickness (particularly, thick enough to stop protons having an energy of at least 200 KeV (0.2 MeV), for example, at least 2 μm) and transparent to the electromagnetic radiation (in particular, solar radiation) in a range of frequencies in which the solar cell is able to carry out the photovoltaic conversion, which perform the same function as the known protective glasses.

Such protective material(s) layers may comprise or consist of oxide layers, particularly non-conductive oxide layers. For the purposes of the present disclosure, a "non-conductive" material is to be intended as meaning a material having an electrical conductivity of less than about $10^{-3}$ $\Omega^{-1}m^{-1}$.

Examples of suitable non-conductive oxides that can be used as protective materials include Silicon oxide ($SiO_2$), Aluminum oxide ($Al_2O_3$), Tantalum oxide ($Ta_2O_5$), Niobium oxide ($Nb_2O_5$), Yttrium oxide ($Y_2O_3$), Titanium oxide ($TiO_2$), Scandium oxide ($Sc_2O_3$), Cerium oxide ($CeO_2$), Hafnium dioxide ($HfO_2$), Tin dioxide ($SnO_2$), $LaTiO_3$.

In addition to non-conductive oxides, other non-conductive materials, transparent in the frequency range used by the solar cell to make the photovoltaic conversion of the electromagnetic radiation (in particular, the sunlight), can be used to form the protective material layer(s), such as for example Magnesium fluoride ($MgF_2$), Cerium fluoride ($CeF_3$), Zinc sulphide (ZnS), Silicon nitride (Si3N4).

Such layers of protective material(s) can be formed (e.g., by deposition of material) over the (active surface of the) solar cell directly or by interposing an adhesive layer, e.g. a layer of a resin between the (active surface of the) solar cell and the layers of protective material(s). It is also possible to form, above the (active surface of the) solar cell, a combination of stacked layers of resin and protective materials, for example a layer of protective material formed (e.g., by deposition of material) directly on the (active surface of the) solar cell, followed by a resin layer formed on the layer of protective material, and, on the resin layer, an additional layer of protective material.

The use of non-conductive materials to form the protective layers makes it possible to form relatively thick protective layers (thicker than in case electrically conductive oxide layers are used) while ensuring a high level of transparency to the electromagnetic radiation (in particular, solar radiation) in the range of frequencies in which the solar cell is able to carry out the photovoltaic conversion. Thicker protective layers are more effective in blocking low-energy protons and other radiations harmful for the solar cell.

In addition, the use of non-conductive materials (instead of electrically conductive oxide layers) as protective layers widens the range of suitable materials that can be chosen, allowing a better choice of the refractive index of the material chosen to form the protective layer.

As mentioned, the layers of protective material(s) can for example be formed by deposition techniques, for example by resorting to any known technique of Physical Vapor Deposition ("PVD"), such as thermal evaporation, electron gun, Pulsed Laser Deposition ("PLD"), cathodic sputtering (or cathodic vaporization) etc. . . .

The adhesive (resin) layer or layers can be made of a resin of the same type as the resins that are normally used to glue the coverglass to the solar cell. The resin used can be a transparent silicone adhesive material, for example the material known commercially as ELASTOSIL® S 695 or S 690, or the elastomeric silicone material commercially known as DC93-500 manufactured by Dow Corning®.

The layers of protective material(s) also protect the resin layer(s) against low energy protons, preventing the resin layer(s) from degradation consequent to exposure to low energy proton radiation.

In accordance with an aspect of the present invention, a method of manufacturing a solar cell is provided, comprising:
providing a solar cell having an active surface intended, in use, to be exposed to sunlight for performing photovoltaic conversion, and
forming, in correspondence of said active surface, a protection against low-energy protons and other radiations harmful to the solar cell.
Said forming a protection includes:
form a resin layer, and
forming by means of deposition of material on the resin layer a layer of a non-conductive protective material, transparent in an electromagnetic radiation frequency range in which the solar cell is intended to perform the photovoltaic conversion, over the resin layer.
Forming by means of deposition of material comprises a physical vapor deposition—PVD—process or processes, particularly thermal evaporation, electron beam, pulsed laser deposition—PLD—, sputtering.

In possible embodiments, said resin layer can be formed directly on the active surface of the solar cell.

In possible embodiments, the method may further comprise:
forming, by means of deposition of material, a further layer of protective material interposed between the resin layer and the active surface of the solar cell.

In possible embodiments, said forming by means of deposition of material a further layer of protective material interposed between the resin layer and the active surface of the solar cell may comprise a physical vapor deposition—PVD—process or processes, for example thermal evaporation, electron beam, pulsed laser deposition—PLD—, sputtering.

In possible embodiments, said layer or layers of protective material can comprise or consist of oxide layers, in particular one or more layers of Silicon oxide ($SiO_2$), Aluminum oxide ($Al_2O_3$), Tantalum oxide ($Ta_2O_5$), Niobium oxide ($Nb_2O_5$), Yttrium oxide ($Y_2O_3$), Titanium oxide ($TiO_2$), Scandium oxide ($Sc_2O_3$), Cerium oxide ($CeO_2$), Hafnium dioxide ($HfO_2$), Tin dioxide ($SnO_2$), $LaTiO_3$, and other materials transparent in the frequency range used by the solar cell to carry out the photovoltaic conversion, including Magnesium fluoride ($MgF_2$), Cerium fluoride ($CeF_3$), Zinc sulphide (ZnS), Silicon nitride (Si3N4).

In possible embodiments, said phase of forming a resin layer may include king a deposition process.

In possible embodiments, the method can include:
forming alternating layers of resin and protective material repeated several times.

In possible embodiments, the method can include:
forming anti-reflective layers atop of the top protection layer.

Preferably, said layer of protective material, or at least one of the layers of protective material, has a thickness greater than about 2 µm.

In accordance with another aspect of the present invention, a solar cell is provided comprising an active surface intended, in use, to be exposed to sunlight for performing photovoltaic conversion, at which active surface a protection against low-energy protons and other radiations harmful to the solar cell is provided. The solar cell is obtained by the manufacturing method in accordance with the above aspect of the present invention.

Said protection against low-energy protons and other harmful radiations can include at least one resin layer and, above the resin layer, at least one layer of a protective material against low-energy protons and other harmful radiations for the solar cell, transparent to solar radiation in a range of frequencies used by the solar cell to carry out the photovoltaic conversion. Said at least one layer of protective material is a layer of deposited, non-conductive material, that can be obtained by deposition of material, for example, physical deposition from vapor phase—Physical Vapor Deposition (PVD)—for example, thermal evaporation, electron beam, Pulsed Laser Deposition (PLD), sputtering.

Said at least one layer of protective material can comprise or consist of oxide layers, in particular one or more layers of Silicon oxide ($SiO_2$), Aluminum oxide ($Al_2O_3$), Tantalum oxide ($Ta_2O_5$), Niobium oxide ($Nb_2O_5$), Yttrium oxide ($Y_2O_3$), Titanium oxide ($TiO_2$), Scandium oxide ($Sc_2O_3$), Cerium oxide ($CeO_2$), Hafnium dioxide ($HfO_2$), Tin dioxide ($SnO_2$), $LaTiO_3$, and other materials transparent in the frequency range used by the solar cell to carry out the photovoltaic conversion, including Magnesium fluoride ($MgF_2$), Cerium fluoride ($CeF_3$), Zinc sulphide (ZnS), Silicon nitride (Si3N4).

Preferably, said at least one layer of a protective material has a thickness greater than 2 µm.

The one or more layers of protective material(s) perform the protective function of the (active surface of) solar cell, blocking low-energy protons and other harmful radiations for the solar cell that are encountered in space environment and at high altitudes in atmosphere. The layer or layers of resin are useful to reduce the mechanical stress due to different coefficients of thermal expansion of the materials used, ensuring, in this way, also a better adhesion of the layer of protective material on the surface of the device.

Thanks to the present invention, it is possible to realize a solar cell protection against low-energy protons and other harmful radiations to the solar cell by means of a method which is integrated in the traditional solar cell manufacturing process itself (based on semiconductor technology). The protection obtained in this way is by far advantageous compared to that obtainable through the application of the usual coverglasses since it does not present the problems related to the ad hoc sizing of the protection glasses, particularly in terms of area. Furthermore, the thickness of the protection is easily adaptable to the specific needs deriving from the specific application of the solar cell. The manufacturing costs of solar cells are consequently significantly reduced. Last but not least, the protection achieved by layers of protective material(s) formed integrally with the solar cell guarantees the flexibility of the solar cell itself, a feature (not achievable with traditional protective glasses) which is particularly useful in the case of thin solar cells.

BRIEF DESCRIPTION OF THE DRAWINGS

These and other features, as well as these and other advantages, of the present invention will be made more apparent by reading the following detailed description of some of its possible embodiments, exemplary and by no means limitative; in the following description reference will be made, for a better intelligibility, to the attached figures, in which.

It should be noted that the drawings shown in the figures are schematic and not necessarily executed to scale. In particular, some details of the drawings can be very exaggerated (compared to their real size) for purely explanatory purposes.

DETAILED DESCRIPTION OF EXEMPLARY EMBODIMENTS OF THE PRESENT INVENTION

Figure 1A:
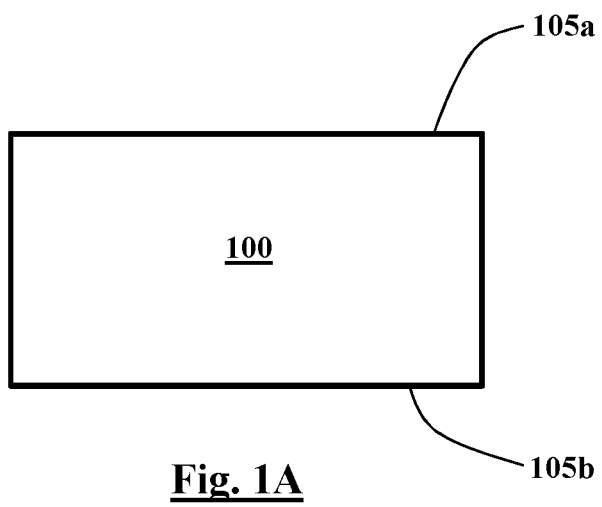
FIGS. 1A to 1C show three stages of a method of manufacturing a solar cell according to an embodiment of the present invention.
Figure 1B:
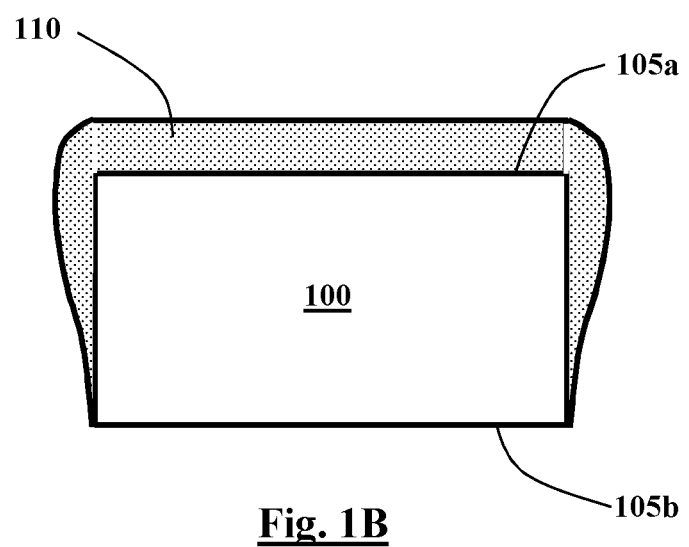
Figure 1C:
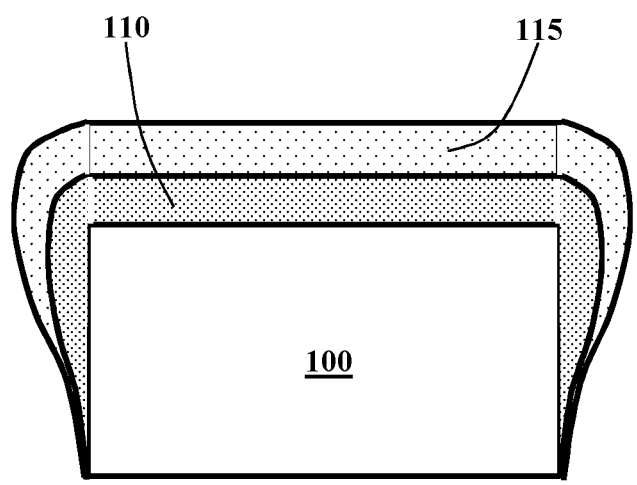

With reference to the drawings, in FIGS. 1A to 1C three phases of a method of manufacturing a solar cell according to an embodiment of the present invention are shown.

Reference 100 denotes a solar cell, such as a space solar cell. The solar cell 100 can for example be a cell in compounds of groups III and V of the periodic table of the elements ("III-V solar cell"), for example in gallium arsenide (GaAs) or in Indium and Gallium phosphide (InGaP). The solar cell 100 can be a single-junction solar cell, i.e. with a single pn junction, or a multi-junction solar cell, with two or more pn junctions, for example a triple junction solar cell (comprising three pn junctions). The steps of the manufacturing process of the solar cell 100 are neither shown nor described as they are known to those skilled in the art.

The solar cell 100 has an active surface 105a (the surface of the solar cell which, in use, is intended to be exposed to sunlight for allowing the solar cell performing the photovoltaic conversion) and an opposite, non-active surface 105b (which in use is not exposed to sunlight) in correspondence of which the solar cell 100 is applied to a support panel (not shown in the drawings).

As shown in FIG. 1B, on the active surface 105 of the solar cell 100 (the surface of the solar cell which, in use, is intended to be exposed to sunlight) a layer of resin 110 transparent to sunlight is formed. The resin may for example be of the same type as the resins which in the art are used to glue the protective coverglass to the solar cell. For example, the resin used may be a transparent silicone adhesive material, for example the material commercially known as Elastosil® S 695 or S 690, or the elastomeric silicone material commercially known as DC93-500 manufactured by Dow Corning®. The resin layer 110 can for example be formed by means of any deposition technique used for the integration of space solar cells (with the usual steps which will not be described as they are known to those skilled in the art). In FIG. 1B it is also shown (in a very exaggerated way compared to the actual dimensions) how, as a consequence of the formation process of the resin layer 110 by deposition, the material of the resin layer 110 protrudes from the edges of the active surface 105a of the solar cell 100 and descends along the lateral walls of the solar cell 100 itself, covering them (in a gradually decreasing way as one moves away from the active surface 105).

The resin layer 110 can for example have a thickness ranging from some tens of microns to about 100 μm.

Turning to FIG. 1C, on the resin layer 110 a layer of protective material 115 is formed which is transparent to sunlight (in the range of wavelengths for which the solar cell is intended to perform the photoelectric conversion) but capable of blocking low-energy protons and other radiations harmful to the solar cell 100. The protective material layer 115 is a layer in a non-conductive material. The protective material layer 115 may comprise or consist of a layer of a non-conductive oxide, e.g. Silicon oxide ($SiO_2$) or oxides of other elements, or other non-conductive materials, transparent in the frequency range used by the solar cell to perform the photovoltaic conversion. For example, in addition to Silicon oxide ($SiO_2$), the protective material layer 115 may comprise or consist of Aluminum oxide ($Al_2O_3$), Tantalum oxide ($Ta_2O_5$), Niobium oxide ($Nb_2O_5$), Yttrium oxide ($Y_2O_3$), Titanium oxide ($TiO_2$), Scandium oxide ($Sc_2O_3$), Cerium oxide ($CeO_2$), Hafnium dioxide ($HfO_2$), Tin dioxide ($SnO_2$), $LaTiO_3$, Indium Tin oxide (also known as Indium-doped Tin Oxide or ITO), or other transparent materials in the frequency range used by the solar cell to carry out the photovoltaic conversion, such as for example Magnesium fluoride ($MgF_2$), Cerium fluoride ($CeF_3$), Zinc sulphide (ZnS), Silicon nitride (Si3N4). The layer of protection material 115 has a suitable thickness, chosen so as to provide, in use, the desired protection of the solar cell 100.

Figure 3:
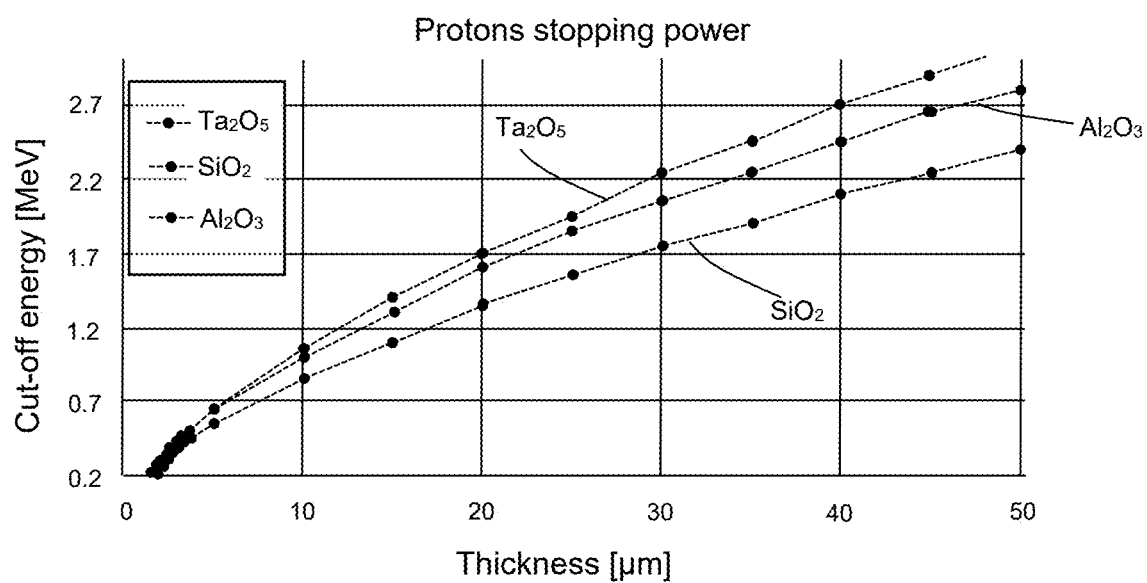
FIG. 3 is a diagram showing the "cut-off" energy as a function of the thickness and the type of protective material used, for certain types of exemplary protective materials.

The shielding power (so-called "Stopping Power") that the layer of protective material 115 has on low-energy protons depends, in addition to the thickness of this layer, on the density and on the atomic composition of the protective material used. The cut-off energy (maximum energy of the protons that the material is able to completely shield), as a function of the thickness of the layer of protective material 115 used, can be obtained using models and calculation codes known in the literature (for example, SRIM, www.s-rim.org). FIG. 3 shows the cut-off energy performance as a function of the thickness of the protective material layer for three types of exemplary protective materials: $SiO_2$, $Al_2O_3$, $Ta_2O_5$.

For example, if the layer of protective material 115 has a thickness of at least 2 μm, the protons with energy less than or equal to 0.2 MeV are shielded.

The layer of protective material 115 can for example be formed by means of deposition techniques, using for example any known technique of Physical Vapor Deposition (PVD), such as thermal evaporation, electronic beam, Pulsed Laser Deposition (PLD), cathodic sputtering (or cathodic vaporization, simply "sputtering") etc. Similarly to FIG. 1B, FIG. 1C also shows (in a very exaggerated way compared to the actual dimensions) how, as a consequence of the process of forming the layer of protective material 115 by deposition, the material of the layer of protective material 115 protrudes from the edges of the active surface 105a of the solar cell 100 and descends along the side walls of the solar cell 100 itself, covering (in a decreasing way as one moves away from the active surface 105) the same side walls (which had already been covered by the material of the resin layer 110).

The manufacture of the solar cell takes place with the usual steps, which will not be described as they are known to those skilled in the art.

The adhesive resin layer 110 has essentially no protection function of the solar cell against low energy protons. The presence of the adhesive resin layer 110 interposed between the layer of protective material 115 and the active surface 105a of the solar cell 100 helps to reduce the mechanical stresses between the layer of protective material 115 and the solar cell 100.

The layer of protective material 115 present above the resin layer 110, in addition to carrying out the function of protection against low-energy protons and other radiations harmful to the solar cell 100, avoids the phenomenon of yellowing ("darkening") of the resin layer 110 which on the contrary could affect the latter as a result of the exposure to ultraviolet radiation in the use of the solar cell. The layer of protective material 115 also protects the resin layer 110 against low energy protons, avoiding the degradation of the resin layer 110 consequent to exposure to low energy proton radiation.

In FIGS. 2A to 2D four phases of a method of manufacturing a solar cell according to another embodiment of the present invention are shown.

Figure 2A:
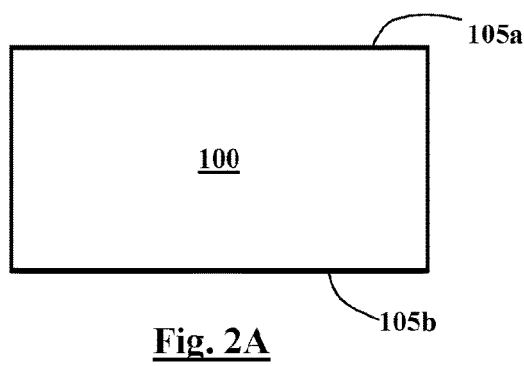
FIGS. 2A to 2D show four steps of a method of manufacturing a solar cell according to another embodiment of the present invention.
Figure 2B:
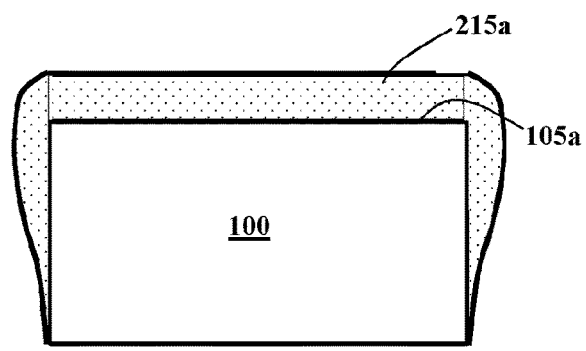

Starting from the solar cell 100 shown in FIG. 2A (as in the embodiment described above, the solar cell 100 can for example be a III-V solar cell, for example in GaAs or InGaP, single junction or multi-junction), on the active surface 105a of the solar cell 100 a first layer of protective material 215a is formed, as shown in FIG. 2B. The layer of protective material 215a is transparent to sunlight (in the range of wavelengths for which the solar cell is intended to perform the photoelectric conversion). The protective material layer 115 is a layer in a non-conductive material. The layer of protective material 215a can, for example, include or consist of a layer of $SiO_2$ or oxides of other elements, or other non-conductive materials transparent in the range of frequencies used by the solar cell to make the photovoltaic conversion. In addition to Silicon oxide ($SiO_2$), the protective material layer 215a may comprise or consist of Aluminum oxide ($Al_2O_3$), Tantalum oxide ($Ta_2O_5$), Niobium oxide ($Nb_2O_5$), Yttrium oxide ($Y_2O_3$), Titanium oxide ($TiO_2$), Scandium oxide ($Sc_2O_3$), Cerium oxide ($CeO_2$), Hafnium dioxide ($HfO_2$), Tin dioxide ($SnO_2$), $LaTiO_3$, or other transparent materials in the frequency range used by the solar cell to perform the photovoltaic conversion, such as for example Magnesium fluoride ($MgF_2$), Cerium fluoride ($CeF_3$), Zinc sulphide (ZnS), Silicon nitride (Si3N4).

The thickness of the layer of protective material 215a can be sized as a function of the energy of the protons that the oxide layer must be able to shield. The layer of protective material 215a can for example be formed by deposition techniques, such as those mentioned in the description of the previous embodiment. In FIG. 2B it is also shown (much exaggerated compared to the actual size) as, in consequence of the forming process of the protective material layer 215a by deposition, the material of the protective material layer 215a overlaps the edge of the active surface 105a of the solar cell 100 and descends along the side walls of the solar cell 100 itself, covering them (in a gradually decreasing way as one moves away from the active surface 105).

Figure 2C:
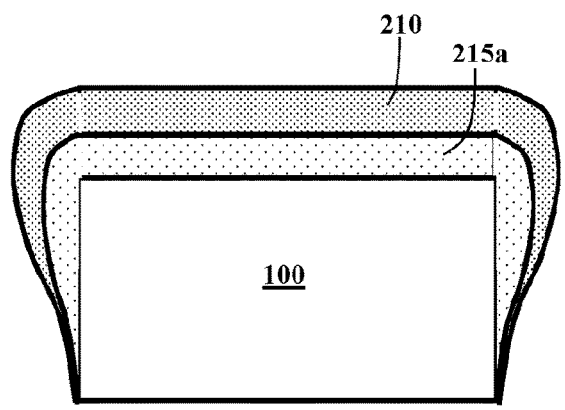

A sunlight transparent resin layer 210 is formed on the first layer of protective material 215a, as shown in FIG. 2C. The resin layer 210 can for example be made as described in relation to the resin layer 110 of the previous embodiment. Also in this case, FIG. 2C also shows (in a very exaggerated way compared to the actual dimensions) how, as a consequence of the formation process of the resin layer 210 by deposition, the material of the resin layer 210 protrudes from the edges of the surface activates 105a of the solar cell 100 and descends along the side walls of the solar cell 100 itself, covering (in a gradually decreasing extent as one moves away from the active surface 105) the side walls themselves (which had already been covered by the material of the material layer protection 215a).

Figure 2D:
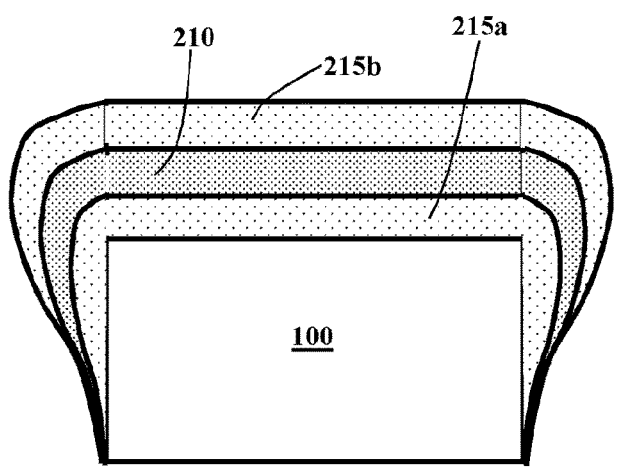

A second layer of sunlight-transparent protective material 215b is formed over the resin layer 210, as shown in FIG. 2D. The second layer of protective material 215b is a layer in a non-conductive material. The second layer of protective material 215b can for example comprise or consist of a layer of $SiO_2$ or oxides of other elements, or other non-conductive materials transparent in the range of frequencies used by the solar cell to carry out the photovoltaic conversion. Also in this case, in addition to $SiO_2$, the layer of protective material 215b can comprise or consist of Aluminum oxide ($Al_2O_3$), Tantalum oxide ($Ta_2O_5$), Niobium oxide ($Nb_2O_5$), Yttrium oxide ($Y_2O_3$), Titanium oxide ($TiO_2$), Scandium oxide ($Sc_2O_3$), Cerium oxide ($CeO_2$), Hafnium dioxide ($HfO_2$), Tin dioxide ($SnO_2$), $LaTiO_3$, or other transparent materials in the frequency range used by the solar cell to perform the photovoltaic conversion, such as for example Magnesium fluoride ($MgF_2$), Cerium fluoride ($CeF_3$), Zinc sulphide (ZnS), Silicon nitride (Si3N4). The layer of protective material 215b can for example be formed by the same deposition techniques used to form the first layer of protective material 215a. In FIG. 2D it is also shown (much exaggerated compared to the actual size) as, in consequence of the protective material layer formation process 215b by deposition, the material of the protective material layer 215b overlaps the edge of the active surface 105a of the solar cell 100 and descends along the side walls of the solar cell 100 itself, covering (in a gradually decreasing extent as one moves away from the active surface 105) the side walls themselves (which had already been covered by the material of the first layer of protective material 215a and the material of the resin layer 210).

The presence of the resin layer 210 helps to reduce the mechanical stress between the layers of protective material 215a and 215b and the solar cell 100.

The layers of protective material 215a and 215b perform the function of protection against low-energy protons and other harmful radiations to the solar cell 100.

The second layer of protective material 215b which covers the resin layer 210 avoids the phenomenon of yellowing (darkening) resulting from exposure to ultraviolet radiation.

The layers of protective material 215a and 215b also protects the resin layer 210 against low energy protons, avoiding the degradation of the resin layer 110 consequent to exposure to low energy proton radiation.

Other embodiments of the present invention are possible, for example by iterating the structure shown in FIG. 2D by forming one or more further pairs of resin layer 210 and protective material layer 215b above the protective material layer 215b.

The materials used to form the resin layers 110, 210, and the materials used to form the layers of protective material(s) 115, 215a, 215b may be different from the materials previously indicated by way of example, and the thicknesses of these layers may vary from the indicated thicknesses.

Over the last layer of protective material (at the top of the solar cell) it is possible to deposit a layer or a multilayer with an anti-reflective function.

The invention claimed is:

1. Method of fabrication of a semiconductor space solar cell for uses in the space or at high altitude in atmosphere, comprising:

providing a semiconductor solar cell having an active surface which, in use, is intended to be exposed to sunlight for performing photovoltaic conversion;

forming, in correspondence of said active surface, a protection against low-energy protons harmful to the solar cell, characterized in that said forming a protection comprises:

forming an adhesive layer of resin and forming by means of deposition of material on the adhesive layer of resin a single layer of a non-conductive protective material, transparent in an electromagnetic radiation frequency range in which the solar cell is intended to perform the photovoltaic conversion, over the adhesive layer of resin, wherein said forming by means of deposition of material comprises a process or processes of physical vapour deposition—"PVD", wherein said single layer of a non-conductive protective material has a thickness greater than 2 μm.

2. Method according to claim 1, wherein said adhesive layer of resin is formed directly on the active surface of the solar cell.

3. Method according to claim 1, further comprising:

forming by means of deposition of material a further layer of protective material interposed between the adhesive layer of resin and the active surface of the solar cell.

4. Method according to claim 3, wherein said forming by means of deposition of material a further layer of protective material interposed between the adhesive layer of resin and the active surface of the solar cell comprise a process or processes of physical vapour deposition—"PVD".

5. Method according to claim 3, wherein said further layer of protective material has a thickness greater than 2 μm.

6. Method according to claim 3, wherein said further layer of protective material comprise or consist of layers of oxide.

7. Method according to claim 6, wherein said further layer of protective material comprises or consists of one or more layers of $SiO_2$ and/or $Al_2O_3$ and/or $Ta_2O_5$ and/or $Nb_2O_5$ and/or $Y_2O_3$ and/or $TiO_2$ and/or $Sc_2O_3$ and/or $CeO_2$ and/or $HfO_2$ and/or $SnO_2$ and/or $LaTiO_3$ and/or other materials transparent in the range of frequencies exploited by the solar cell for performing the photovoltaic conversion, comprising $MgF_2$ and/or $CeF_3$ and/or ZnS and/or $Si_3N_4$.

8. Method according to claim 4, wherein said forming by means of deposition of material a further layer of protective material interposed between the adhesive layer of resin and the active surface of the solar cell comprise one among the processes of: thermal evaporation, electron beam, pulsed-laser deposition—"PLD", sputtering.

9. Method according to claim 1, wherein said single layer of protective material comprise or consist of layers of oxide.

10. Method according to claim 9, wherein said layers of oxide comprise or consist of one or more layers of $SiO_2$ and/or $Al_2O_3$ and/or $Ta_2O_5$ and/or $Nb_2O_5$ and/or $Y_2O_3$ and/or $TiO_2$ and/or $Sc_2O_3$ and/or $CeO_2$ and/or $HfO_2$ and/or $SnO_2$ and/or $LaTiO_3$ and/or other materials transparent in the range of frequencies exploited by the solar cell for performing the photovoltaic conversion, comprising $MgF_2$ and/or $CeF_3$ and/or ZnS and/or $Si_3N_4$.

11. Method according to claim 1, wherein said phase of forming an adhesive layer of resin comprises a process of deposition.

12. Method according to claim 1, further comprising:

forming alternated adhesive layers of resin and layers of protective material repeated more times over said single layer of a non-conductive protective material.

13. Method according to claim 12, wherein said alternated adhesive layers of resin and layers of protective material comprise a topmost layer of protective material, the method further comprising:

forming anti-reflecting layers on the topmost layer of protective material.

14. Method according to claim 1, further comprising:

forming anti-reflecting layers on the single layer of protective material.

15. Method according to claim 1, wherein said semiconductor solar cell is a III-V solar cell in compounds of groups III and V of the periodic table of the elements.

16. Method according to claim 15, wherein said semiconductor solar cell is a solar cell in one among: gallium arsenide (GaAs), Indium and Gallium phosphide (InGaP).

17. Method according to claim 1, wherein said process or processes of physical vapour deposition—"PVD"—comprises one among: thermal evaporation, electron beam, pulsed-laser deposition—"PLD", sputtering.

* * * * *